(12) United States Patent
Hwang et al.

(10) Patent No.: US 11,107,546 B2
(45) Date of Patent: Aug. 31, 2021

(54) MEMORY DEVICE AND OPERATING METHOD THEREOF

(71) Applicant: SK hynix Inc., Gyeonggi-do (KR)

(72) Inventors: Mi-Hyun Hwang, Seoul (KR); Jong-Chern Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 64 days.

(21) Appl. No.: 16/726,741

(22) Filed: Dec. 24, 2019

(65) Prior Publication Data
US 2020/0388344 A1   Dec. 10, 2020

(30) Foreign Application Priority Data

Jun. 5, 2019  (KR) .................. 10-2019-0066757

(51) Int. Cl.
| | | |
|---|---|---|
| G11C 11/00 | (2006.01) | |
| G11C 7/00 | (2006.01) | |
| G11C 29/02 | (2006.01) | |
| G11C 29/00 | (2006.01) | |
| G11C 7/10 | (2006.01) | |
| G11C 29/24 | (2006.01) | |
| G11C 29/44 | (2006.01) | |

(52) U.S. Cl.
CPC .......... *G11C 29/025* (2013.01); *G11C 7/1012* (2013.01); *G11C 7/1039* (2013.01); *G11C 29/24* (2013.01); *G11C 29/44* (2013.01); *G11C 29/702* (2013.01)

(58) Field of Classification Search
CPC ..... G11C 29/785; G11C 17/18; G11C 29/808; G11C 29/04; G11C 29/44; G11C 29/78; G11C 29/4401; G11C 11/408; G11C 2029/1204; G11C 29/42
See application file for complete search history.

(56) References Cited

U.S. PATENT DOCUMENTS

| | | | |
|---|---|---|---|
| 6,272,056 B1 * | 8/2001 | Ooishi ................ | G11C 29/848 365/189.18 |
| 2008/0191990 A1 * | 8/2008 | Matsubara ............... | G09G 3/20 345/98 |
| 2013/0117636 A1 * | 5/2013 | Kim ....................... | G11C 29/04 714/773 |

FOREIGN PATENT DOCUMENTS

| | | |
|---|---|---|
| KR | 10-0322538 | 3/2002 |
| KR | 10-2014-0027810 | 3/2014 |

\* cited by examiner

*Primary Examiner* — Hien N Nguyen
(74) *Attorney, Agent, or Firm* — IP & T Group LLP (57) ABSTRACT

Disclosed are a memory device and an operating method thereof, and the memory device includes a plurality of first data lines, a plurality of second data lines, a common redundant memory region coupled to at least one repair line of the second data lines, a plurality of normal memory regions coupled to the first data lines in common, and coupled in common to the remaining the second data lines excluding the repair line, and a repair circuit coupled to the first and second data lines, and suitable for replacing at least one defective memory cell in the normal memory regions with at least one redundant memory cell in the common redundant memory region by shifting some or all of the first data lines to some or all of the second data lines, based on a row address, a column address and a region address.

21 Claims, 6 Drawing Sheets

MEMORY DEVICE AND OPERATING METHOD THEREOF

CROSS-REFERENCE TO RELATED APPLICATION

This application claims priority under 35 U.S.C. § 119 to Korean Patent Application No. 10-2019-0066757, filed on Jun. 5, 2019, the disclosure of which is incorporated herein by reference in its entirety.

BACKGROUND

1. Field

Various embodiments of the present invention relate to a semiconductor design technique, and more particularly, to a memory device having a repair function and an operating method thereof.

2. Description of the Related Art

A memory device may have a repair function. For example, the repair function may replace a defective memory cell with a redundant memory cell (spare memory cell).

In general, since a memory device has a structure in which a spare memory region is allocated per memory region, for example, a bank, a defective memory cell in a particular memory region can be replaced only with a spare memory cell in the corresponding allocated spare memory region.

Accordingly, when the number of defective memory cells in a given memory region is larger than the number of spare memory cells in the corresponding allocated spare memory region, the spare memory region does not have enough spare memory cells to replace all the defective memory cells. Conversely, a larger spare memory region, i.e., one that holds more spare memory cells than there are memory cells in the corresponding memory region occupies an unnecessarily large area.

A memory device may operate at cryogenic temperature, and in doing so consumes much less power than a memory device operating at room temperature. For example, a memory cell included in a Dynamic Random Access memory (DRAM) operating at cryogenic temperature has a longer data retention time than that of a DRAM operating at room temperature. Therefore, the DRAM operating at cryogenic temperature rarely performs a refresh operation or maximizes a refresh period, thereby reducing power consumption.

The presence of defective memory cells in a memory device operating at cryogenic temperature remains a concern. In this context, embodiments of the present invention arise.

SUMMARY

Various embodiments of the present invention are directed to a memory device in which a plurality of normal memory regions share one redundant memory region, and an operating method thereof.

In accordance with an embodiment, a memory device may include: a plurality of first data lines; a plurality of second data lines; a common redundant memory region coupled to at least one repair line of the second data lines; a plurality of normal memory regions coupled to the first data lines in common, and coupled in common to the remaining the second data lines excluding the repair line; and a repair circuit coupled to the first and second data lines, and suitable for replacing at least one defective memory cell in the normal memory regions with at least one redundant memory cell in the common redundant memory region by shifting some or all of the first data lines to some or all of the second data lines, based on a row address, a column address and a region address.

In accordance with another embodiment, a memory device may include: a plurality of first global data lines; a plurality of second global data lines; a plurality of third global data lines; a common redundant memory region coupled to a repair line among the second global data lines; a plurality of normal memory regions coupled to the first global data lines in common, and coupled in common to the remaining second global data lines, excluding the repair line; a first detector suitable for detecting a defective memory cell, and generating a first detection signal, based on a row address, a column address and a region address; a second detector suitable for generating a second detection signal corresponding to a defective line through which data of the defective memory cell is transmitted among the first global data lines, based on the first detection signal; and a line shifter coupled to the first to third global data lines, and suitable for shifting at least one of the first global data lines disposed on one side with respect to the defective line to at least one of the second global data lines based on the second detection signal.

In accordance with still another embodiment, an operating method of a memory device may include: entering a write mode; detecting that a defective memory cell is present in the memory device; detecting a defective line through which write data corresponding to the defective memory cell among a plurality of write data is transmitted, among first global data lines; shifting at least one of the first global data lines disposed on one side with respect to the defective line to at least one of second global data lines; and writing one bit of write data of the plurality of write data to a common redundant memory region, and writing the remaining write data of the plurality of write data to a normal memory region in which the defective memory cell is not present.

The operating method may further include: entering a read mode; detecting that the defective memory cell is present in the memory device; detecting the defective line among the first global data lines; shifting at least one of the first global data lines disposed on one side with respect to the defective line to at least one of the second global data lines; and reading one bit of read data of a plurality of read data from the common redundant memory region, and reading the remaining read data of the plurality of read data from the normal memory region in which the defective memory cell is not present.

In accordance with still another embodiment, a memory system may include: multiple normal memory regions; multiple first data lines, multiple second data lines and multiple third data lines; a common redundant memory region; a repair line; and a repair circuit coupled to the common redundant memory region by the repair line, the repair circuit further comprising multiple shift logic circuits, each of which includes multiple switches for selecting one of the multiple first data lines and the multiple second data lines in response to a shift control signal and coupling the selected data line to one of the multiple third data lines.

DETAILED DESCRIPTION

Various embodiments are described below in more detail with reference to the accompanying drawings. These embodiments are provided so that this disclosure is thorough and complete, and fully conveys the scope of the present disclosure to those skilled in the art. Throughout the disclosure, like reference numerals refer to like parts. Also, throughout the specification, reference to "an embodiment," "another embodiment" or the like is not necessarily to only one embodiment, and different references to any such phrase are not necessarily to the same embodiment(s).

Figure 1:
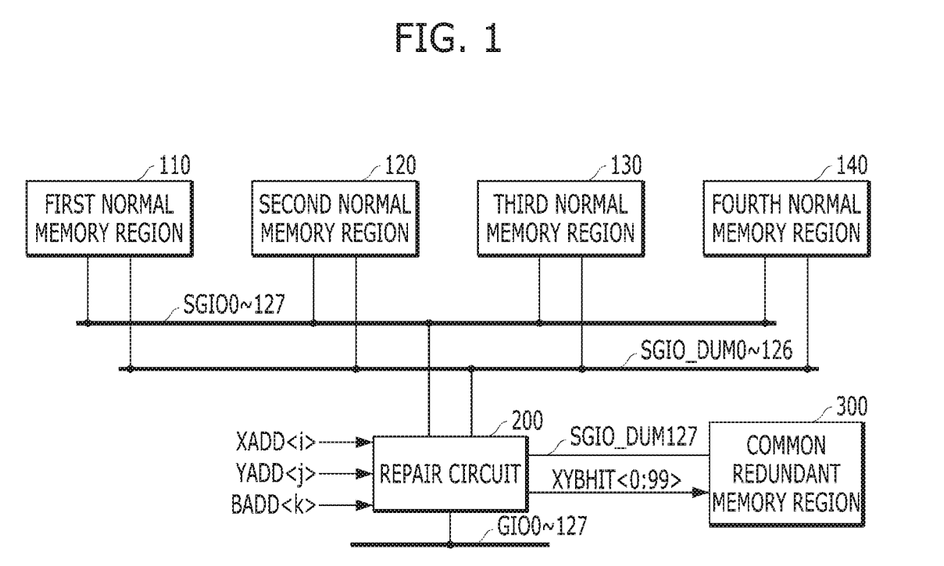
FIG. 1 is a block diagram illustrating components of a memory device in accordance with an embodiment.

FIG. 1 is a block diagram illustrating a memory device in accordance with an embodiment.

Referring to FIG. 1, the memory device may include a plurality of normal memory regions 110, 120, 130 and 140, a repair circuit 200 and a common redundant memory region 300.

The plurality of normal memory regions 110 to 140 may be coupled to first global data lines SGIO0 to SGIO127 in common. The normal memory regions 110 to 140 may be coupled to second global data lines SGIO_DUM0 to SGIO_DUM126 in common. Such memory regions 110 to 140, however, are not coupled to the second global data line SGIO_DUM127, which is a repair line and denoted as such in the description below.

The repair circuit 200 may be coupled to the first global data lines SGIO0 to SGIO127, the second global data lines SGIO_DUM0 to SGIO_DUM127, and third global data lines GIO0 to GIO127. The repair circuit 200 may repair at least one defective memory cell included in any of the normal memory regions 110 to 140, based on a row address XADD<i>, a column address YADD<j> and a region address BADD<k>. For example, the repair circuit 200 may select a memory cell according to the row address XADD<i>, the column address YADD<j> and the region address BADD<k>, and detect whether or not the selected memory cell is a defective memory cell, and if so, generate a first detection signal XYBHIT<0:99>. The repair circuit 200 may replace the defective memory cell with a redundant memory cell included in the common redundant memory region 300 by shifting some or all of the first global data lines SGIO0 to SGIO127 to some or all of the second global data lines SGIO_DUM0 to SGIO_DUM127, based on the first detection signal XYBHIT<0:99>. The repair circuit 200 may shift at least one first global data line, which is disposed on one side with respect to a defective line of the first global data lines SGIO0 to SGIO127, to at least one second global data line of the second global data lines SGIO_DUM0 to SGIO_DUM127. The defective line is a line through which data of the defective memory cell is transmitted. The at least one second global data line may include the repair line SGIO_DUM127.

The common redundant memory region 300 may be coupled to the repair line SGIO_DUM127. The common redundant memory region 300 may be coupled to the repair circuit 200 through the repair line SGIO_DUM127. The common redundant memory region 300 may replace the defective memory cell with the redundant memory cell based on the first detection signal XYBHIT<0:99>.

Figure 2:
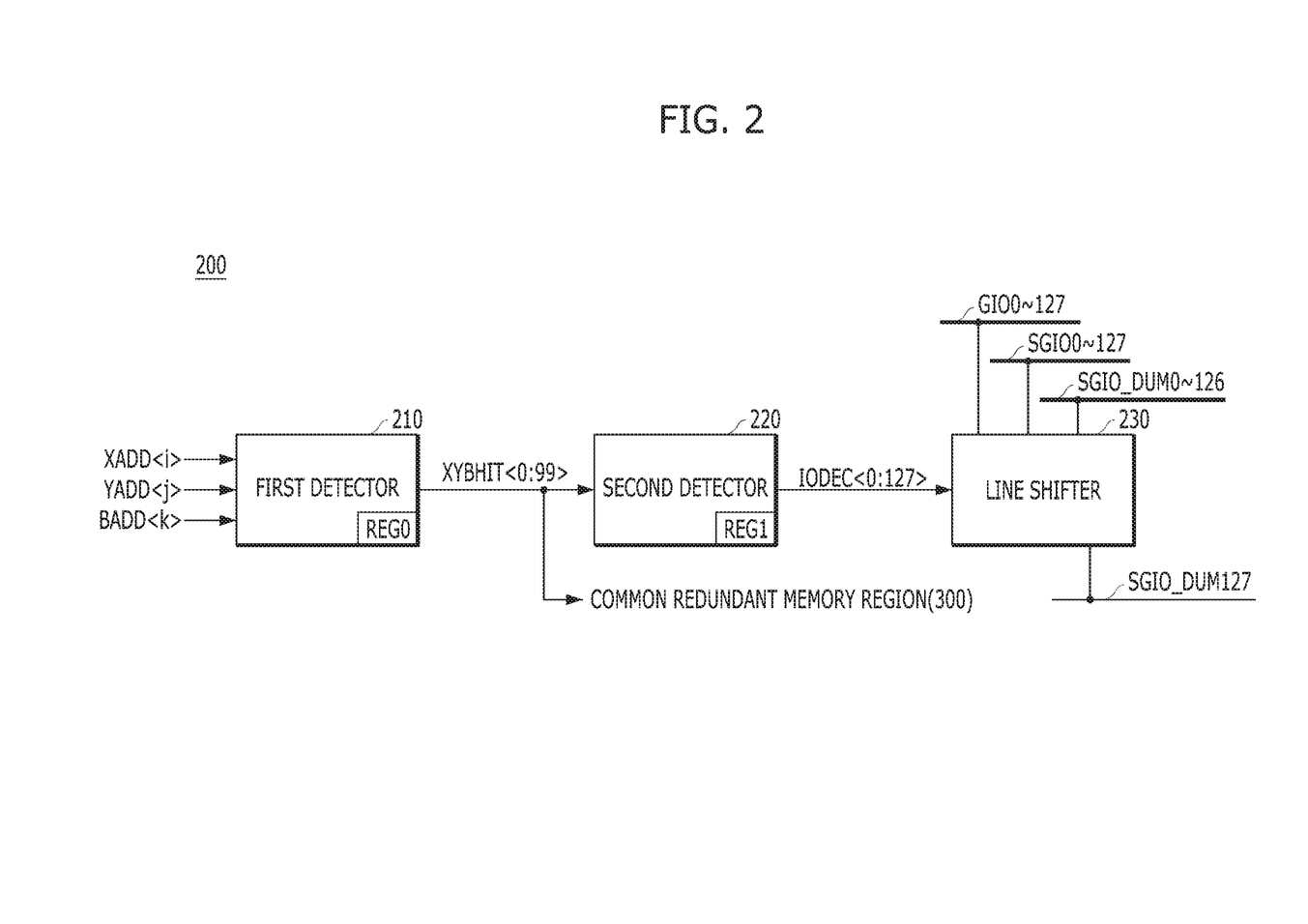
FIG. 2 is a block diagram illustrating a repair circuit, such as that illustrated in FIG. 1.

FIG. 2 is a block diagram illustrating the repair circuit 200 illustrated in FIG. 1.

Referring to FIG. 2, the repair circuit 200 may include a first detector 210, a second detector 220 and a line shifter 230.

The first detector 210 may detect whether or not the selected memory cell is a defective memory cell, and, if so, generate the first detection signal XYBHIT<0:99>, based on the row address XADD<i>, the column address YADD<j> and the region address BADD<k>. For example, the first detector 210 may compare the row address XADD<i>, the column address YADD<j> and the region address BADD<k> with a row address, a column address and a region address of the defective memory cell, which are previously stored, respectively. The first detector 210 may generate the first detection signal XYBHIT<0:99> corresponding to the comparison result. The first detector 210 may include a storage REG0 in which the row, column and region addresses indicating the position of the defective memory cell are stored. For example, the storage REG0 may include 100 fuse sets corresponding to 100 bits of the first detection signal XYBHIT<0:99>. The 100 fuse sets in the storage REG0 may store addresses of 100 defective memory cells. The 100 defective memory cells may be randomly distributed in at least one normal memory region of the normal memory regions 110 to 140. The first detector 210 may provide the first detection signal XYBHIT<0:99> to the common redundant memory region (300 of FIG. 1).

The second detector 220 may generate a second detection signal IODEC<0:127> corresponding to the defective line of the first global data lines SGIO0 to SGIO127, based on the first detection signal XYBHIT<0:99>. For example, the second detector 220 may compare the first detection signal XYBHIT<0:99> with a previously stored line address indicating the position of the defective line. The second detector 220 may generate the second detection signal IODEC<0:127> based on the line address. The second detector 220 may include a storage REG1 in which the line address is stored. For example, the storage REG1 may include 100 fuse sets corresponding to 100 bits of the first detection signal XYBHIT<0:99>. The 100 fuse sets in the storage REG1 may store line addresses of 100 defective lines of the first global data lines SGIO0 to SGIO127.

The line shifter 230 may be coupled to the first global data lines SGIO0 to SGIO127, the second global data lines SGIO_DUM0 to SGIO_DUM127, and the third global data lines GIO0 to GIO127. The line shifter 230 may shift at least one first global data line disposed on one side with respect to the defective line to at least one second global data line, based on the second detection signal IODEC<0:127>. As described above, the at least one second global data line may include the repair line SGIO_DUM127.

Figure 3:
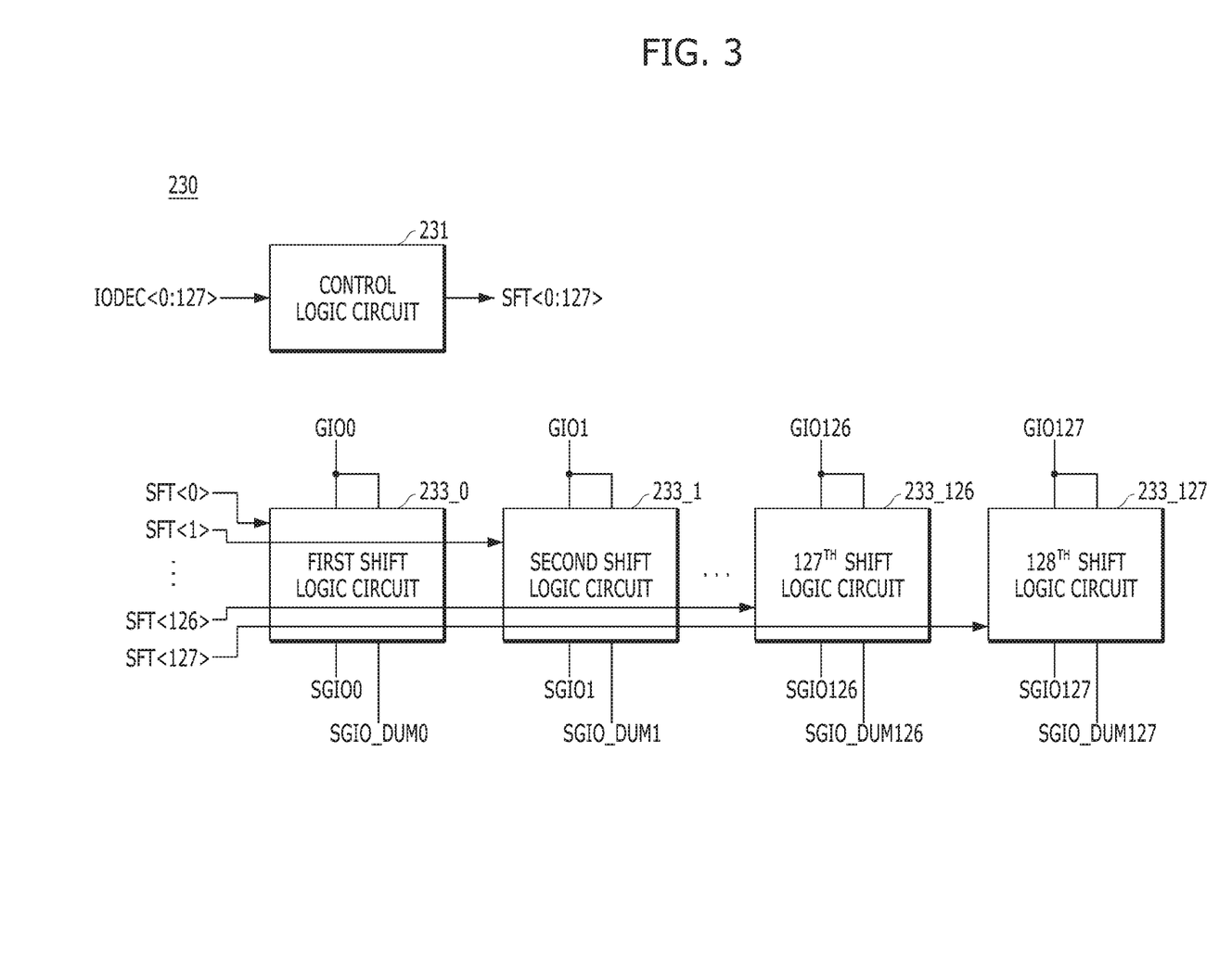
FIG. 3 is a block diagram illustrating a line shifter, such as that illustrated in FIG. 2.

FIG. 3 is a block diagram illustrating the line shifter 230 illustrated in FIG. 2.

Referring to FIG. 3, the line shifter 230 may include a control logic circuit 231 and a plurality of shift logic circuits 233_0 to 233_127.

The control logic circuit 231 may generate a plurality of shift control signals SFT<0:127> based on the second detection signal IODEC<0:127>. The plurality of shift control signals SFT<0:127> may correspond to the first global data lines SGIO0 to SGIO127, respectively. For example, the control logic circuit 231 may activate a shift control signal corresponding to the defective line of the first global data lines SGIO0 to SGIO127, among the shift control signals SFT<0:127>. Further, the control logic circuit 231 may activate at least one shift control signal corresponding to the at least one first global data line, disposed on one side with respect to the defective line, among the shift control signals SFT<0:127>.

The shift logic circuits 233_0 to 233_127 may be respectively coupled to the first global data lines SGIO0 to SGIO127, the second global data lines SGIO_DUM0 to SGIO_DUM127, and the third global data lines GIO0 to GIO127. For example, the first shift logic circuit 233_0 may be coupled to the first global data line SGIO0, the second global data line SGIO_DUM0 and the third global data line GIO0. Each of the shift logic circuits 233_0 to 233_127 may select one of the first global data lines SGIO0 to SGIO127 and one of the second global data lines SGIO_DUM0 to SGIO_DUM127 based on the shift control signals SFT<0:127>. Each of the shift logic circuits 233_0 to 233_127 may couple the selected global data line to one of the third global data lines GIO0 to GIO127. For example, the first shift logic circuit 233_0 may select one of the first global data line SGIO0 and the second global data line SGIO_DUM0, and couple the selected global data line to the third global data line GIO0. Each of the shift logic circuits 233_0 to 233_127 may be configured the same or substantially the same. Accordingly, the first shift logic circuit 233_0 is described below by way of example.

Figure 4:
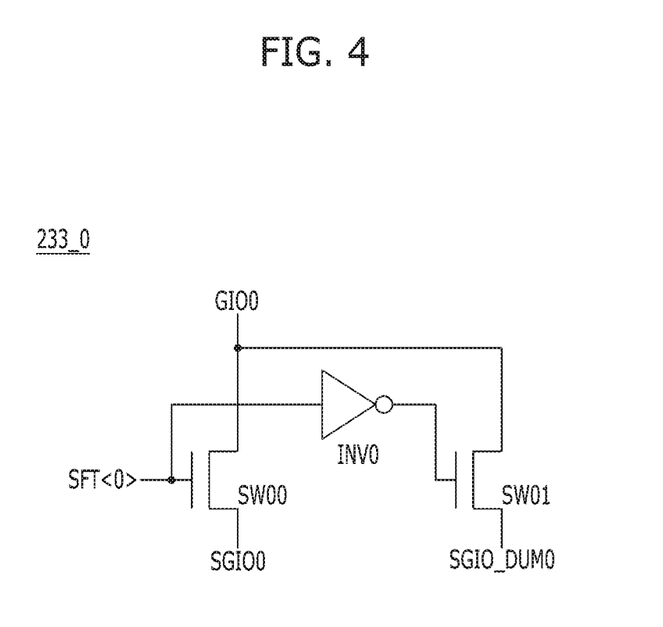
FIG. 4 is a circuit diagram illustrating a shift logic circuit, such as that illustrated in FIG. 3.

FIG. 4 is a circuit diagram illustrating the first shift logic circuit 233_0 illustrated in FIG. 3.

Referring to FIG. 4, the first shift logic circuit 233_0 may include a first coupling component SW00, an inversion component, i.e., an inverter, INV0 and a second coupling component SW01.

The first coupling component SW00 may couple the third global data line GIO0 to the first global data line SGIO0 based on the shift control signal SFT<0> of the shift control signals SFT<0:127>.

The inversion component INV0 may invert the shift control signal SFT<0>, and generate an inverted shift control signal.

The second coupling component SW01 may couple the third global data line GIO0 to the second global data line SGIO_DUM0 based on the inverted shift control signal.

Figure 5:
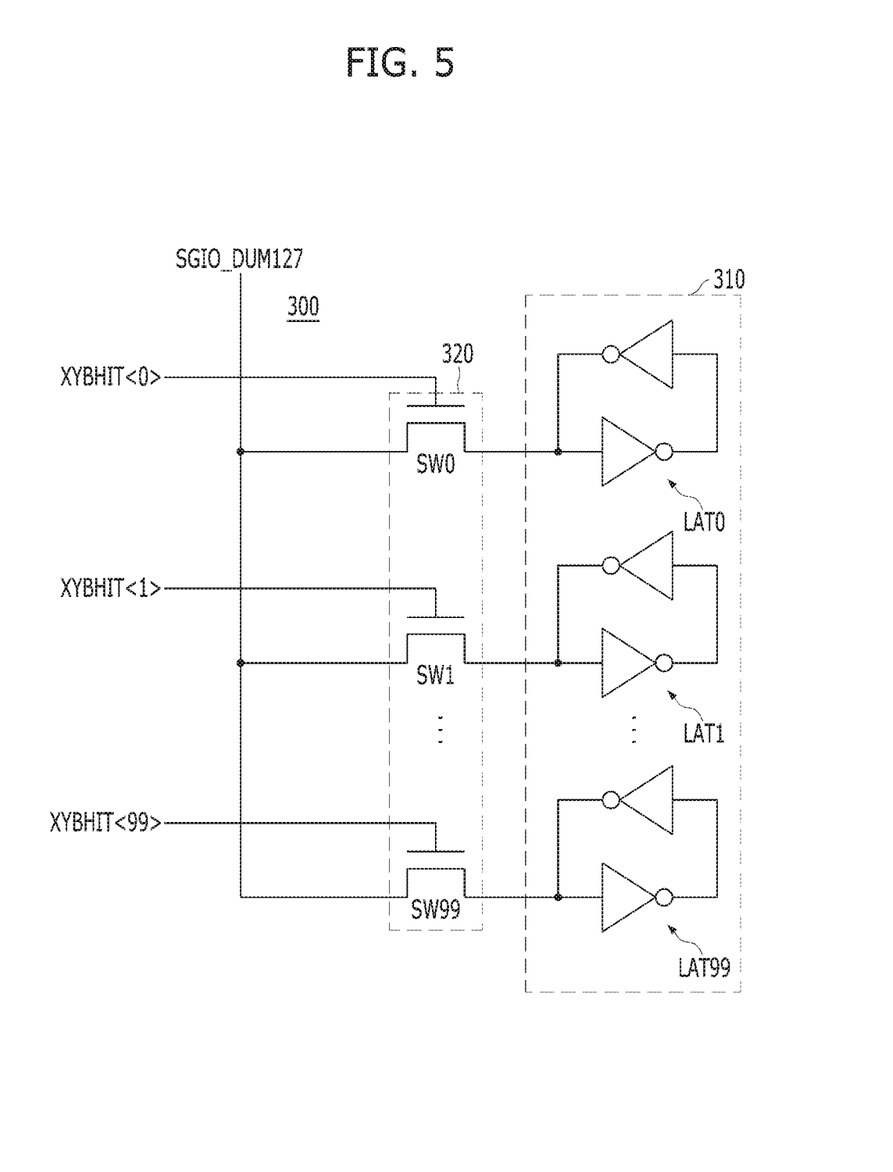
FIG. 5 is a circuit diagram illustrating a common redundant memory region, such as that illustrated in FIG. 1.

FIG. 5 is a circuit diagram illustrating the common redundant memory region 300 illustrated in FIG. 1.

Referring to FIG. 5, the common redundant memory region 300 may include a plurality of redundant memory cells 310 and a plurality of switches 320.

Each of the redundant memory cells 310 may be coupled to each of the switches 320. Each of the redundant memory cells 301 may include a latch. For example, the redundant memory cells 301 may include 100 latches LAT0 to LAT99 corresponding to 100 bits of the first detection signal XYBHIT<0:99>. In other words, the 100 latches LAT0 to LAT99 may replace the 100 defective memory cells. Although it is described in the present embodiment that that each of the redundant memory cells 301 includes a latch, the present invention is not limited thereto. For example, each of the redundant memory cells 310 may include a Static Random Access Memory (SRAM) instead of a latch.

The switches 320 may be coupled in parallel to the repair line SGIO_DUM127. In other words, the switches 320 may be coupled to between the repair line SGIO_DUM127 and the redundant memory cells 310. The switches 320 may be controlled based on the first detection signal XYBHIT<0: 99>. For example, the switches 320 may include 100 switches SW0 to SW99 corresponding to 100 bits of the first detection signal XYBHIT<0:99>. Each of the switches SW0 to SW99 may couple a corresponding latch of the redundant memory cells 310 to the repair line SGIO_DUM127 according to a corresponding bit of the first detection signal XYBHIT<0:99>.

Figure 6:
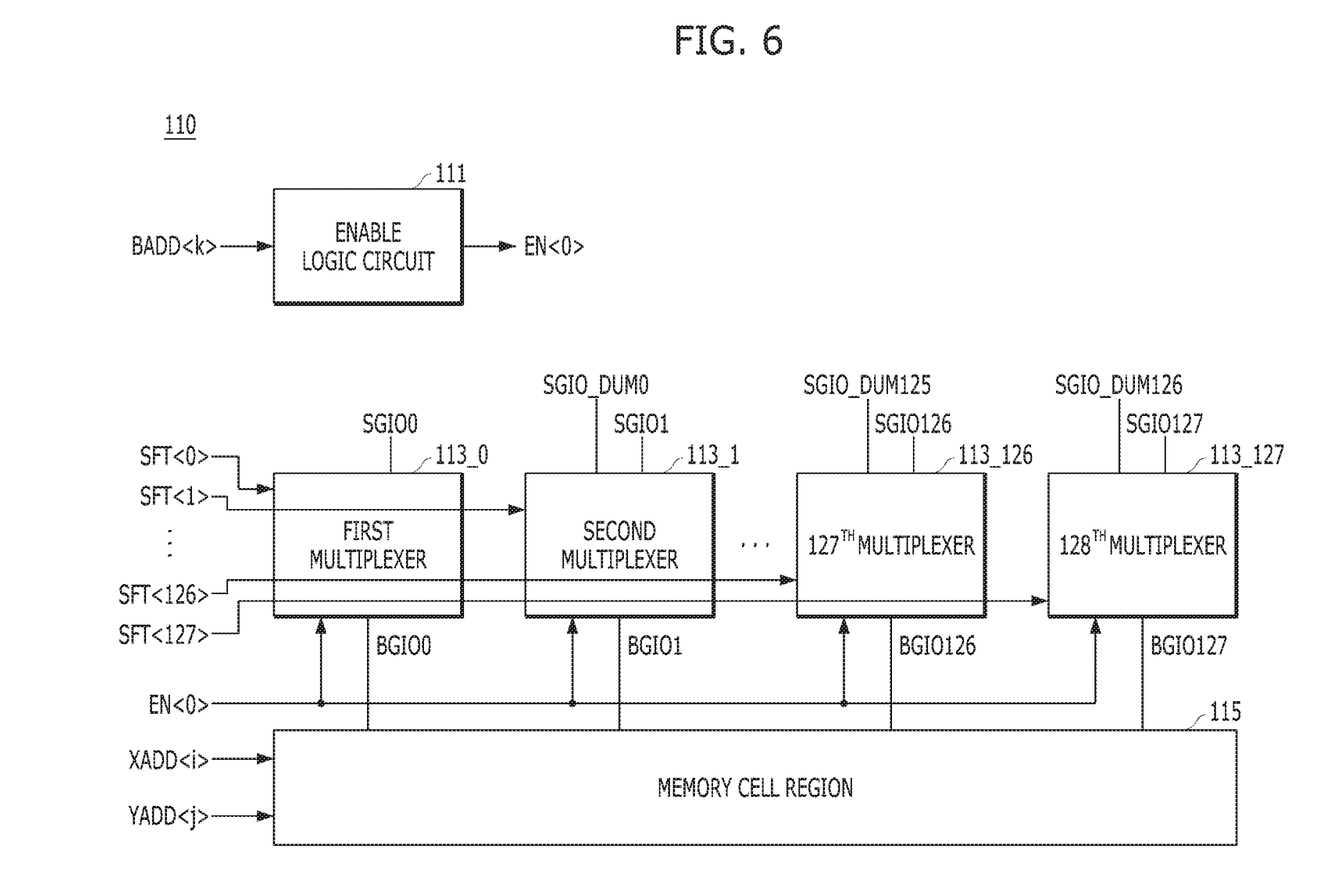
FIG. 6 is a block diagram illustrating a normal memory region, such as that illustrated in FIG. 1.

FIG. 6 is a block diagram illustrating the normal memory regions 110 to 140 illustrated in FIG. 1. Each of the normal regions may be the same or substantially the same. Hence, FIG. 6 representatively illustrates the first normal memory region 110 as an example.

Referring to FIG. 6, the first normal memory region 110 may include an enable logic circuit 111, a plurality of multiplexers 113_0 to 113_127 and a memory cell region 115.

The enable logic circuit 111 may generate a first region enable signal EN<0> based on the region address BADD<k>. For example, the enable logic circuit 111 may activate the first region enable signal EN<0> when the region address BADD<k> indicates the first normal memory region 110, and deactivate the first region enable signal EN<0> when the region address BADD<k> indicates any one of the second to fourth normal memory regions 120, 130 and 140.

The multiplexers 113_0 to 113_127 may be enabled based on the first region enable signal EN<0>. The multiplexers 113_0 to 113_127 may be respectively coupled to the first global data lines SGIO0 to SGIO127, the second global data lines SGIO_DUM0 to SGIO_DUM126 and fourth global data lines BGIO0 to BGIO127. For example, the second multiplexer 113_1 may be coupled to the first global data line SGIO1, the second global data line SGIO_DUM0 and the fourth global data line BGIO1. Each of the multiplexers 113_0 to 113_127 may select one of the first global data lines SGIO0 to SGIO127 and one of the second global data lines SGIO_DUM0 to SGIO_DUM126 based on the shift control signals SFT<0:127>. For example, the second multiplexer 113_1 may select any one of the first global data line SGIO1 and the second global data line SGIO_DUM0, and couple the selected global data line to the fourth global data line BGIO1. Although it is illustrated that the first multiplexer 113_0 is coupled to the first global data line SGIO0 and the fourth global data line BGIO0 because there is no corresponding second global data line, the first multiplexer 113_0 may be coupled to a separate dummy line instead of the second global data line.

The memory cell region 115 may be coupled to the fourth global data lines BGIO0 to BGIO127. The memory cell region 115 may select a memory cell according to the row address XADD<i> and the column address YADD<j>. The memory cell region 115 may store write data loaded onto the fourth global data lines BGIO0 to BGIO127 in the selected memory cells, in a write mode. The memory cell region 115 may read data from the selected memory cells, and output the read data to the fourth global data lines BGIO0 to BGIO127, in a read mode.

Hereinafter, an operation of the memory device having the above-described configuration in accordance with an embodiment is described.

An operation of the memory device in the e mode is described below.

When the memory device enters the write mode, a plurality of write data may be transmitted to the repair circuit 200 through the third global data lines GIO0 to GIO127. For example, 128 bits write data may be transmitted to the repair circuit 200 through the third global data lines GIO0 to GIO127.

The repair circuit 200 may detect whether or not a defective memory cell is present in selected memory cells, and detect a defective line of the first global data lines SGIO0 to SGIO127. The defective line is a line through which write data corresponding to the defective memory cell is transmitted.

When no defective memory cell is detected, the write data transmitted through the third global data lines GIO0 to GIO127 may be written to a memory cell region 115 included in a normal memory region selected among the first to fourth normal memory regions 110 to 140 through the repair circuit 200. On the other hand, when a defective memory cell is detected, the repair circuit 200 may shift some or all of the first global data lines SGIO0 to SGIO127 to some or all of the second global data lines SGIO_DUM0 to SGIO_DUM127, and replace the defective memory cell with a redundant memory cell included in the common redundant memory region 300. The repair circuit 200 may shift at least one first global data line disposed on one side with respect to the defective line, among the first global data lines SGIO0 to SGIO127, to at least one second global data line disposed on one side with respect to a second global data line corresponding to the defective line among the second global data lines SGIO_DUM0 to SGIO_DUM127. The at least one second global data line may include the repair line SGIO_DUM127. For example, when the first global data line SGIO126 is the defective line, the repair circuit 200 may shift the first global data lines SGIO126 and SGIO127 to the second global data lines SGIO_DUM126 and SGIO_DUM127, respectively.

Accordingly, 1 bit of write data of the 128 bit write data may be written to the common redundant memory region 300 through the repair circuit 200, and the other 127 bits of write data may be written to the memory cell region 115 included in the normal memory region selected among the first to fourth normal memory regions 110 to 140 through the repair circuit 200. Herein, the defective memory cell is excluded from the memory cell region 115.

An operation of the memory device in the read mode is described below.

When the memory device enters the read mode, a plurality of data may be read from a memory cell region 115 included in a normal memory region selected among the first to fourth normal memory regions 110 to 140. For example, 128 bits of data may be read from the memory cell region 115.

The repair circuit 200 may detect whether or not a defective memory cell is present in selected memory cells, and detect a defective line of the first global data lines SGIO0 to SGIO127. The defective line is a line through which read data corresponding to the defective memory cell is transmitted.

When no defective memory cell is detected, the read data transmitted through the first global data lines SGIO0 to SGIO127 may be transmitted to the third global data lines GIO0 to GIO127 through the repair circuit 200.

When a defective memory cell is detected, the repair circuit 200 may shift some or all of the first global data lines SGIO0 to SGIO127 to some or all of the second global data lines SGIO_DUM0 to SGIO_DUM127, and replace the defective memory cell with a redundant memory cell included in the common redundant memory region 300. The repair circuit 200 may shift at least one first global data line disposed on one side with respect to the defective line, among the first global data lines SGIO0 to SGIO127, to at least one second global data line disposed on one side with respect to a second global data line corresponding to the defective line, among the second global data lines SGIO_DUM0 to SGIO_DUM127. The at least one second global data line may include the repair line SGIO_DUM127. For example, when the first global data line SGIO126 is the defective line, the repair circuit 200 may shift the first global data lines SGIO126 and SGIO127 to the second global data lines SGIO_DUM126 and SGIO_DUM127, respectively.

Accordingly, 1 bit of data of the 128 bits of read data may be read from the common redundant memory region 300 through the repair circuit 200, and the other 127 bits of read data may be read from the memory cell region 115 included in the normal memory region selected among the first to fourth normal memory regions 110 to 140 through the repair circuit 200. Herein, the defective memory cell is excluded from the memory cell region 115.

In accordance with embodiments of the present embodiment, a plurality of normal memory regions share one redundant memory region, thereby improving flexibility and responsiveness in repairing a defective memory cell.

Such effect and advantage are even more prominent in a memory device that operates at pseudo cryogenic temperature.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. A memory device comprising:
a plurality of first data lines;
a plurality of second data lines;
a common redundant memory region coupled to at least one repair line of the second data lines;
a plurality of normal memory regions coupled to the first data lines in common, and coupled in common to the remaining the second data lines excluding the repair line; and
a repair circuit coupled to the first and second data lines, and suitable for replacing at least one defective memory cell in the normal memory regions with at least one redundant memory cell in the common redundant memory region by shifting some or all of the first data lines to some or all of the second data lines, based on a row address, a column address and a region address.

2. The memory device of claim 1, wherein the repair circuit shifts at least one of the first data lines disposed on one side with respect to a defective line through which data of the defective memory cell is transmitted, to at least one of the second data lines.

3. The memory device of claim 2, wherein the at least one repair line coupled to the common redundant memory region comprises one repair line which is an outer line among the second data lines.

4. The memory device of claim 1, wherein the repair circuit detects the at least one defective memory cell based on the row, column and region addresses, and shifts some or all of the first data lines to some or all of the second data lines based on the detection result.

5. The semiconductor device of claim 1, wherein the repair circuit comprises:

a first detector suitable for detecting the defective memory cell, and generating a first detection signal, based on the row, column and region addresses;

a second detector suitable for generating a second detection signal corresponding to a defective line through which data of the defective memory cell is transmitted among the first data lines, based on the first detection signal; and a line shifter suitable for shifting at least one of the first data lines disposed on one side with respect to the defective line to at least one of the second data lines based on the second detection signal.

6. The memory device of claim 5,
wherein the at least one of the second data lines comprises the at least one repair line coupled to the common redundant memory region, and
wherein the at least one repair line coupled to the common redundant memory region comprises one repair line that is an outer line among the second data lines.

7. The memory device of claim 5, wherein the first detector comprises a storage in which the row, column and region addresses indicating a position of the at least one defective memory cell are stored.

8. The memory device of claim 5, wherein the second detector comprises a storage in which a line address indicating a position of the defective line is stored.

9. The memory device of claim 5, wherein the line shifter comprises:
a control logic circuit suitable for generating a plurality of shift control signals based on the second detection signal; and
a plurality of shift logic circuits, each suitable for selecting any one of the first data lines and the second data lines based on the shift control signals, and coupling the selected data line to any one of a plurality of third data lines.

10. The memory device of claim 9, wherein each of the shift logic circuits comprises:
a first coupling component suitable for coupling a corresponding third data line to a corresponding first data line based on a corresponding shift control signal;
an inversion component suitable for inverting the corresponding shift control signal, and generating an inverted shift control signal; and
a second coupling component suitable for coupling the corresponding third data line to a corresponding second data line based on the inverted shift control signal.

11. The memory device of claim 1, wherein the redundant memory cell comprises a Static Random Access Memory (SRAM) or a latch.

12. A memory device comprising:
a plurality of first global data lines;
a plurality of second global data lines;
a plurality of third global data lines;
a common redundant memory region coupled to a repair line among the second global data lines;
a plurality of normal memory regions coupled to the first global data lines in common, and coupled in common to the remaining second global data lines, excluding the repair line;
a first detector suitable for detecting a defective memory cell, and generating a first detection signal, based on a row address, a column address and a region address;
a second detector suitable for generating a second detection signal corresponding to a defective line through which data of the defective memory cell is transmitted among the first global data lines, based on the first detection signal; and a line shifter coupled to the first to third global data lines, and suitable for shifting at least one of the first global data lines disposed on one side with respect to the defective line to at least one of the second global data lines based on the second detection signal.

13. The memory device of claim 12, wherein the common redundant memory region comprises:
a plurality of switches coupled in parallel to the repair line, and controlled based on the first detection signal; and
a plurality of redundant memory cells coupled to the switches, respectively.

14. The memory device of claim 13, wherein each of the redundant memory cells comprises a Static Random Access Memory (SRAM) or a latch.

15. The memory device of claim 12, wherein the line shifter comprises:
a control logic circuit suitable for generating a plurality of shift control signals based on the second detection signal; and
a plurality of shift logic circuits, each suitable for selecting any one of the first global data lines and the second global data lines based on the shift control signals, and coupling the selected global data line to any one of the third data lines.

16. The memory device of claim 15, wherein each of the shift logic circuits comprises:
a first coupling component suitable for coupling a corresponding third global data line to a corresponding first global data line based on a corresponding shift control signal;
an inversion component suitable for inverting the corresponding shift control signal, and generating an inverted shift control signal; and
a second coupling component suitable for coupling the corresponding third global data line to a corresponding second global data line based on the inverted shift control signal.

17. The memory device of claim 12, wherein the first detector comprises a storage in which the row, column and region addresses indicating a position of the defective memory cell are stored.

18. The memory device of claim 12, wherein the second detector comprises a storage in which a line address indicating a position of the defective line is stored.

19. An operating method of a memory device comprising:
entering a write mode;
detecting that a defective memory cell is present in the memory device;
detecting a defective line through which write data corresponding to the defective memory cell among a plurality of write data is transmitted, among first global data lines;
shifting at least one of the first global data lines disposed on one side with respect to the defective line to at least one of second global data lines; and
writing one bit of write data of the plurality of write data to a common redundant memory region, and writing the remaining write data of the plurality of write data to a normal memory region in which the defective memory cell is not present.

20. The operating method of claim 19, further comprising:
entering a read mode;
detecting that the defective memory cell is present in the memory device;
detecting the defective line among the first global data lines;
shifting at least one of the first global data lines disposed on one side with respect to the defective line to at least one of the second global data lines; and
reading one bit of read data of a plurality of read data from the common redundant memory region, and reading the remaining read data of the plurality of read data from the normal memory region in which the defective memory cell is not present.

21. A memory system comprising:
multiple normal memory regions;
multiple first data lines, multiple second data lines and multiple third data lines;
a common redundant memory region;
a repair line; and
a repair circuit coupled to the common redundant memory region by the repair line, the repair circuit further comprising multiple shift logic circuits, each of which includes multiple switches for selecting one of the multiple first data lines and the multiple second data lines in response to a shift control signal and coupling the selected data line to one of the multiple third data lines.

* * * * *